United States Patent [19]

Heep

[11] Patent Number: 5,341,089
[45] Date of Patent: Aug. 23, 1994

[54] VOLTAGE TO DECIBEL CONVERTER HAVING PARTIAL TABLE LOOKUP

[75] Inventor: Jerry J. Heep, Weatherford, Tex.

[73] Assignee: Tandy Corporation, Fort Worth, Tex.

[21] Appl. No.: 858,814

[22] Filed: Mar. 27, 1992

[51] Int. Cl.⁵ .................. G01R 15/08; G01R 15/10
[52] U.S. Cl. .................. 324/115; 324/132; 381/56
[58] Field of Search ............. 324/99 D, 103 P, 103 A, 324/115, 121, 116, 141, 142, 120, 132; 364/571.01, 571.07, 581, 582, 577, 483; 381/56

[56] References Cited

U.S. PATENT DOCUMENTS

| | | | |
|---|---|---|---|
| 3,965,418 | 6/1976 | Bauer et al. | 324/99 D |
| 4,000,463 | 12/1976 | Katzmann et al. | 324/132 |
| 4,011,509 | 3/1977 | Edwards | 324/142 |
| 4,112,264 | 9/1978 | Abramson et al. | 324/103 P |
| 4,290,111 | 9/1981 | Dillon | 324/142 |
| 4,300,203 | 11/1981 | Brown | 364/572 |
| 4,388,590 | 6/1983 | Richards et al. | 324/120 |
| 4,414,638 | 11/1983 | Talambiras | 364/571.07 |
| 4,689,759 | 8/1987 | Anouar et al. | 364/577 |
| 4,721,944 | 1/1988 | Kiikuniya et al. | 364/577 |
| 4,794,369 | 12/1988 | Haferd | 324/142 |
| 4,879,671 | 11/1989 | Rieder et al. | 364/571.07 |
| 4,901,258 | 2/1990 | Akiyama | 364/571.07 |
| 4,980,634 | 12/1990 | Mallinson | 324/142 |
| 5,134,573 | 7/1992 | Goodwin | 364/577 |

FOREIGN PATENT DOCUMENTS 092464  8/1975  Canada ............. 364/571.07

Primary Examiner—Ernest F. Karlsen
Attorney, Agent, or Firm—Cesari and McKenna

[57] ABSTRACT

A multimeter converts an input voltage into decibels. Preferably, the input voltage is converted into dbm. The multimeter includes a table of voltage values wherein each entry is associated with a given decibel value. The input voltage is compared with entries in the table to locate a first entry which is larger than the input voltage. A second entry having a lower value than the input voltage is then located in the table. A fractional value that is indicative of where the input voltage lies at a range between the first entry and the second entry is calculated using the first and second entries. The fractional value is added to a decibel value corresponding the second entry to produce a decibel value for the input voltage. The input voltage may be scaled down into an appropriate operational voltage range and then the calculated decibel value may be scaled up to compensate for this scaling down.

28 Claims, 5 Drawing Sheets

VOLTAGE TO DECIBEL CONVERTER HAVING PARTIAL TABLE LOOKUP

FIELD OF THE INVENTION

The present invention relates generally to voltage to decibel converters, and, more particularly, to multimeters having a voltage to decibel conversion capability.

DESCRIPTION OF THE PRIOR ART

A multimeter is a multipurpose instrument that can measure resistance, voltage, or current of an input. In addition, certain multimeters are able to measure decibels of the input. The decibel may be expressed as a logarithmic function of a ratio of powers of two signals. In particular, $$\text{decibels} = 10 \log_{10}(P2)/(P1)$$

where P1 is the power of a first signal, and P2 is the power of a second signal. It is a common practice to calculate decibels relative to a fixed power level. For instance, the unit "dbm" is a measurement of the power level of a signal (P2) relative to one milliwatt (i.e., P1 equals one milliwatt).

Multimeters that have the capability of converting the voltage of an input signal into dbm have generally adopted one of two approaches. In the first approach, special hardware or a special microprocessor has been employed to perform the calculation of dbm. As this calculation involves a logarithmic function, it is not a trivial operation, and special hardware has been necessary. This hardware generally has added substantial cost to the system and often times has occupied a large portion of the available circuit board space. In addition, this approach has required the calculation of dbm every time that a new input has been received.

In the second approach that has been adopted by conventional multimeters to calculate dbm, a large lookup table of dbm values has been maintained. The lookup table is indexed by the voltage of the input signal. However, given the large number of different values that the input voltage may assume within the specified input range, a large table has been necessary. Furthermore, given that a system may operate over different input voltage ranges, a separate table or portion of a table has been required for each range. As a result, a large amount of memory has been occupied by these tables.

It is, therefore, an object of the present invention to provide a voltage to decibel converter that employs simple and inexpensive components.

It is a further object of the present invention to provide a voltage to decibel converter with minimal memory requirements.

Summary of the Invention

The foregoing and other objects are realized in the present invention which concerns a method of converting an input voltage into decibels. In accordance with the method of the present invention, a table of voltage values is provided wherein each entry is associated with a decibel value. The input voltage is compared with entries in the table to locate a first entry that is larger than the input voltage. Preferably, the first entry is closer in magnitude to the input voltage than any other entry in the table having a higher voltage than the input voltage. Once the first entry is located in the table, a second entry that is smaller than the input voltage is located in the table. Preferably, the second entry is closer in magnitude to the input voltage than any other entry that is lower than the input voltage.

Once the first and second entries are located, a fractional value indicative of where the input voltage lies in the range defined between the first entry and the second entry is determined. A decibel value corresponding with the fractional value is added to a decibel value corresponding to the second entry to produce a decibel value of the input voltage. Preferably, this decibel value for the input voltage is measured in dbm.

A multimeter may include a display which is used to display the decibel value for the input. In such instances, the decibel value corresponding with fractional value may be rounded to one decibel place to ensure easy display of the decibel value for the input.

If the input range of the input voltage exceeds the operational range for the multimeter, it may be necessary to scale down the input voltage into an operational range. The resulting scaled down input voltage is then used to locate the first and second entries. The fractional value is added to the decibel value corresponding the second entry to produce an intermediate decibel value. Then, the decibel value for the input is calculated by compensating for the scaling down. In particular, an offset is added to the intermediate decibel value to produce the decibel value for the input. A second table of decibel values may be provided wherein each entry is a decibel value associated with a low value in an input range. When such second table is employed, the offset is selected to be equal to an entry in the second table that is indexed according to the input range of the input.

BRIEF DESCRIPTION OF THE DRAWINGS

A preferred embodiment of the present invention will now be described with reference to the drawings in which.

DETAILED DESCRIPTION OF A PREFERRED EMBODIMENT

Figure 1:
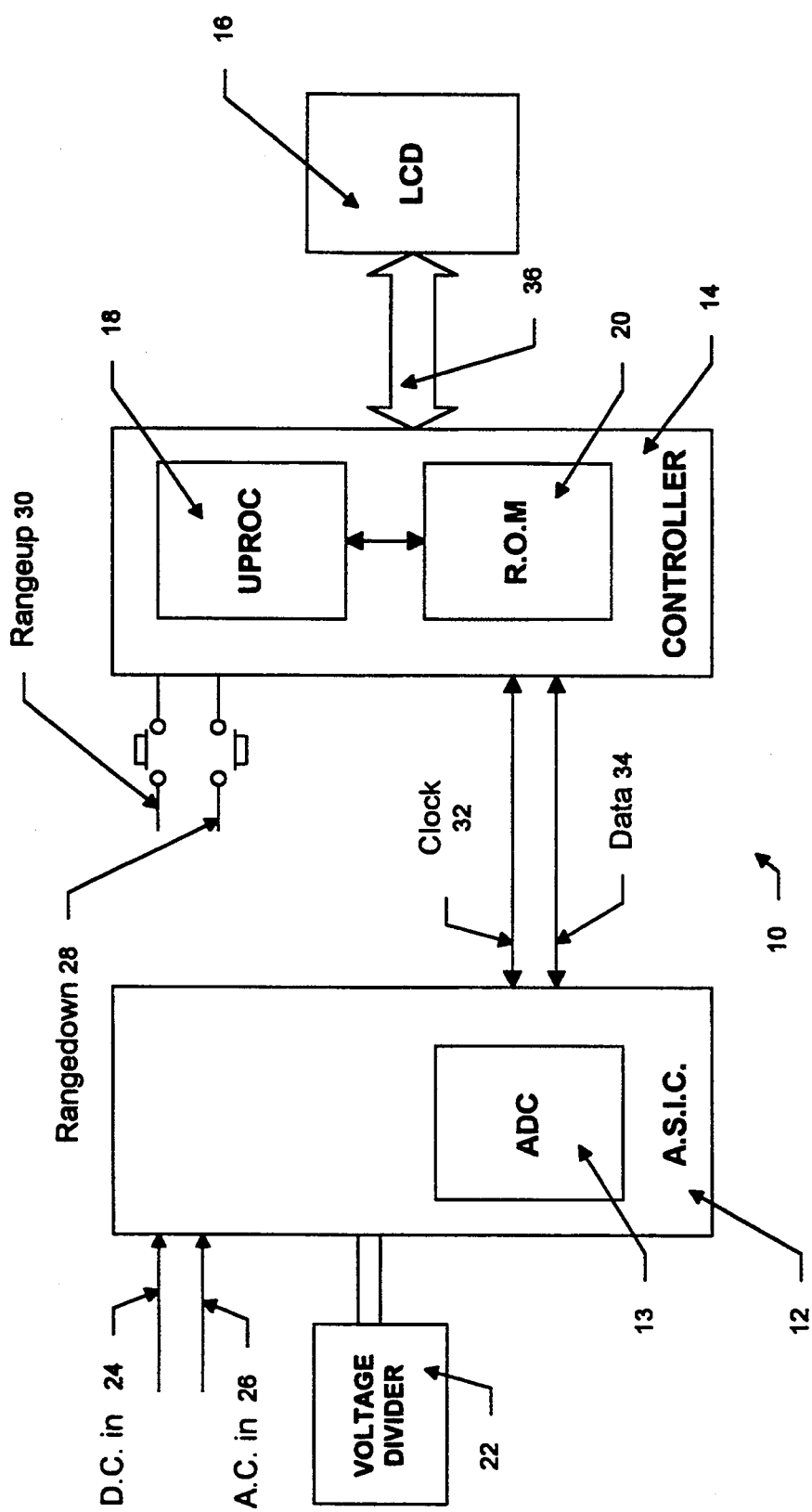
FIG. 1 is a block diagram of a multimeter in accordance with a preferred embodiment of the present invention.

A preferred embodiment of the present invention will now be described with reference to FIG. 1.

The preferred embodiment of the present invention is concerned with a multimeter 10 that has the capability of converting a voltage of an input signal into dbm. As shown in FIG. 1, this multimeter 10 includes an ASIC 12, a controller 14 and a liquid crystal display (LCD) 16. The ASIC 12 serves as an interface with the input signals of the multimeter 10. The ASIC 12 may receive either a direct current (DC) input on line 24 or an alternating current (AC) input on line 26. The user of the multimeter specifies whether a DC or AC input is to be received. The input voltage is scaled down to an appropriate range by a voltage divider 22. The ASIC 12 includes an analog to digital converter (ADC) 13 for converting the scaled down input into a digital output.

The input is scaled down to have a voltage range properly adapted for the ADC 13. A suitable ASIC is described in copending application No. 07/859,142, filed on Mar. 27, 1992, by Paul T. Schreiber and Douglas R. Curtis for a Single String Resistive Divider Network for a Digital Multimeter.

A data line 34 and a clock line 32 interconnect the ASIC 12 with the controller 14. The clock line 32 is used to carry clock signals, and the data line 34 is used to carry data and control information. The controller 14 includes a microprocessor 18 and a read only memory (ROM) 20 that is used by the microprocessor. The controller 14 is connected to switches 28 and 30 which allow a user of the multimeter 10 to adjust the input range downward or upward, respectively. The controller 14 is additionally coupled to the LCD 16 by a communication path 36. A suitable controller is the M50930.

The multimeter 10 may operate in a number of different modes in a manner analogous to conventional multimeters. For instance, it may operate in a mode where it measures current, in a mode where it measures resistance or in a mode where it measures dbm. When the multimeter 10 is operated in a mode where it measures dbm, the multimeter operates as follows. An input voltage is received over either the DC input line 24 or the AC input line 26. As mentioned above, the operator of the multimeter 10 specifies whether an AC or DC input is received. The operator selects an input range using the switches 28 and 30, or the microprocessor 18 senses the input range automatically. This input range is conveyed by the controller 14 over the data line 34 to the ASIC 12. The ASIC is, thus, aware of the selected input range and configures the voltage divider 22 appropriately so as to divide the input voltage received on line 24 or 26 down to an appropriate operational range for the ADC 13. The ADC 13 converts the input voltage into digital output. The digital output encodes the scaled down voltage level which is sent over the data line 34 to the controller 14, along with a clock signal that is sent over line 32. The microprocessor 18 in the controller 14 then executes a routine for converting the transmitted voltage into dbm. In performing the routine, the microprocessor 18 utilizes the ROM 20 as will be described in more detail below. The resulting dbm value is then sent by the controller 14 over communication path 36 to the LCD 16 wherein the value is displayed in a digital format.

Figure 2:
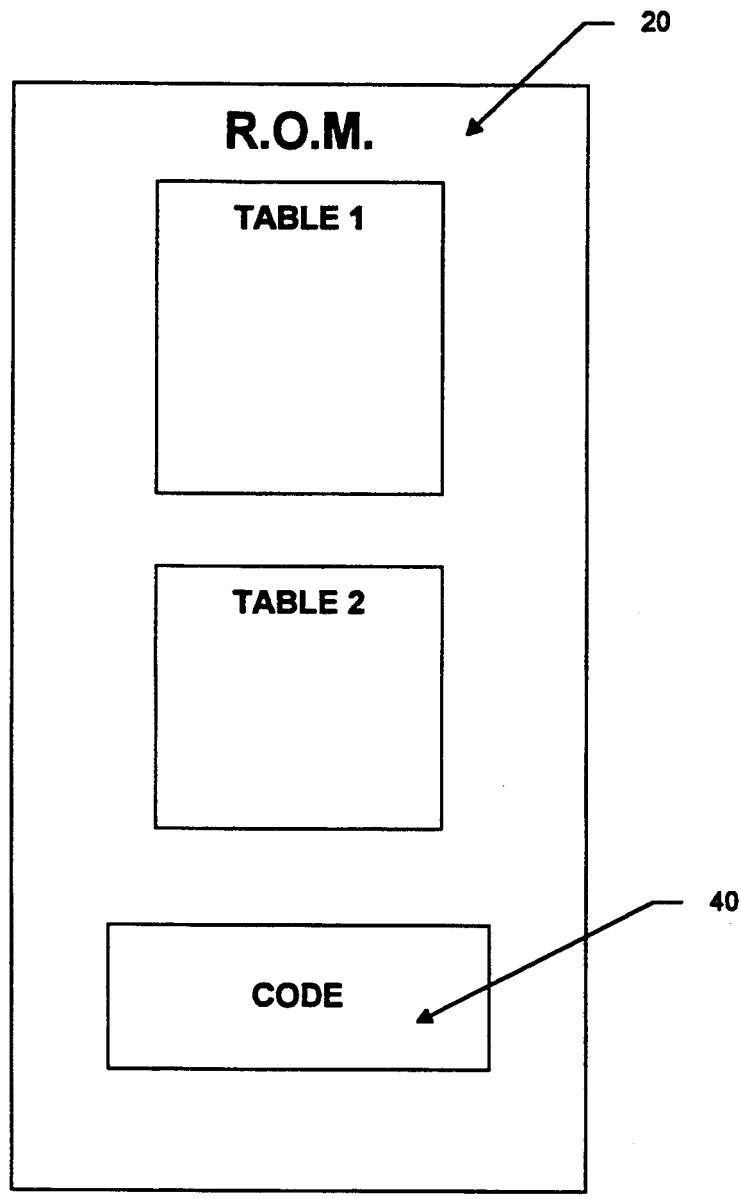
FIG. 2 is a block diagram showing what is held in the ROM 20 of FIG. 1.

Before discussing the steps performed by the microprocessor 18 in more detail, it is helpful to briefly examine the ROM 20 and the LCD 16 in greater detail. As shown in FIG. 2, the ROM 20 holds two tables, Table 1 and Table 2. In addition, the ROM 20 holds a section of code 40. Each entry in Table 1 is a voltage value corresponding to a respective dbm value. For instance, Table 1 may have entries for each dbm value in the range from −60 dbm to +20 dbm. Hence, there are entries corresponding to the voltage associated with −60 dbm, −59 dbm, −58 dbm, . . . . +20 dbm.

Table 2 holds dbm values associated with the input range that is specified by the user. Like conventional multimeters, the multimeter 10 (FIG. 1) of the present invention operates over selected input ranges. As mentioned above, the voltage value transmitted from the ASIC 12 (FIG. 1) to the controller 14 is a scaled down value. The multimeter 10 must have a means for compensating for this scaling down of the input voltage. Table 2 (FIG. 2) serves this function by providing a base dbm value that is associated with the lowest voltage value in the input range. The use of Table 1 and Table 2 will be described in more detail below.

The code 40 is used to control operation of the microprocessor 18. In particular, the code contains the instructions that are run on the microprocessor 18 to control operation of the multimeter 10. This code may be written in a suitable format, such as assembly language.

Figure 3:
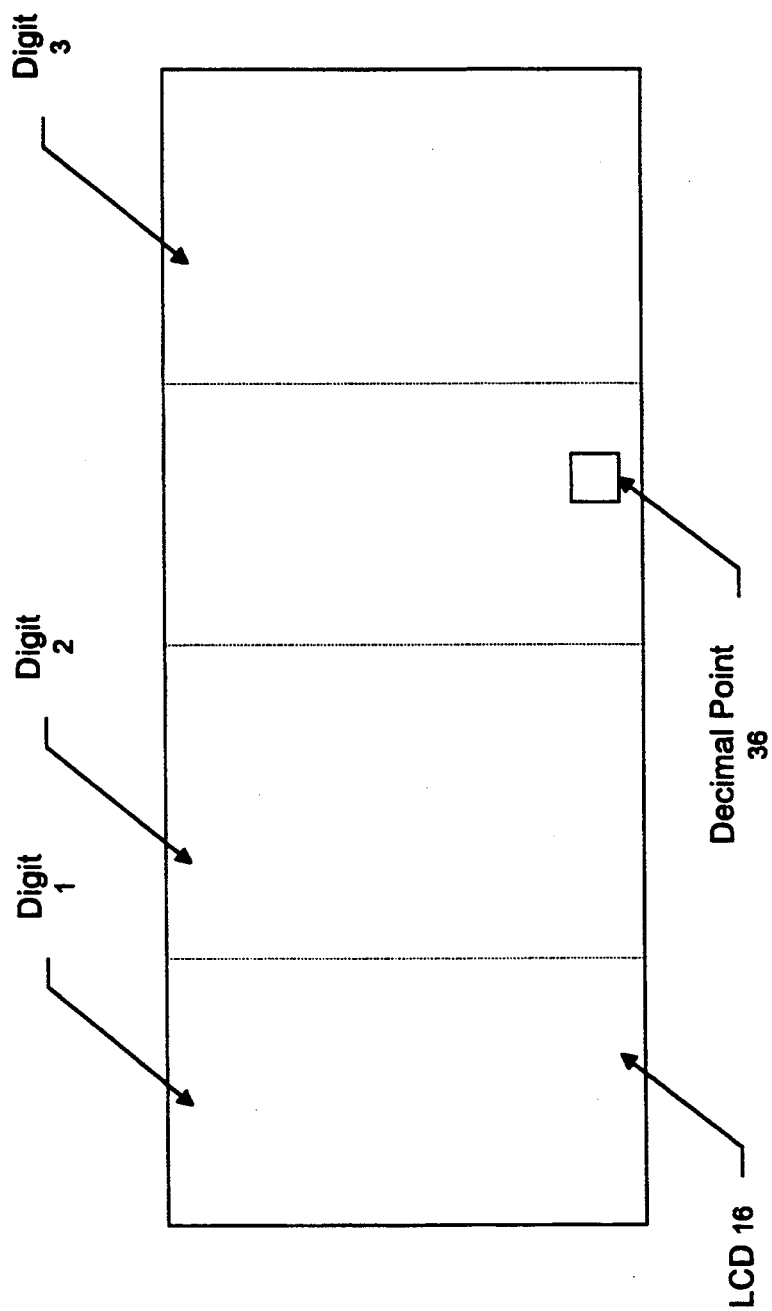
FIG. 3 is a diagram depicting the LCD 16 of FIG. 1 in more detail.

An illustrative LCD 16 is shown in FIG. 3. This LCD includes at least three digit display positions: digit 1, digit 2 and digit 3. The LCD is designed with a built in decimal point 36. Digit 3 is configured so that it displays the tenths position of the output value. Digit 2 displays the ones position, and digit 1 displays the tenths position of the output value.

Figure 4A:
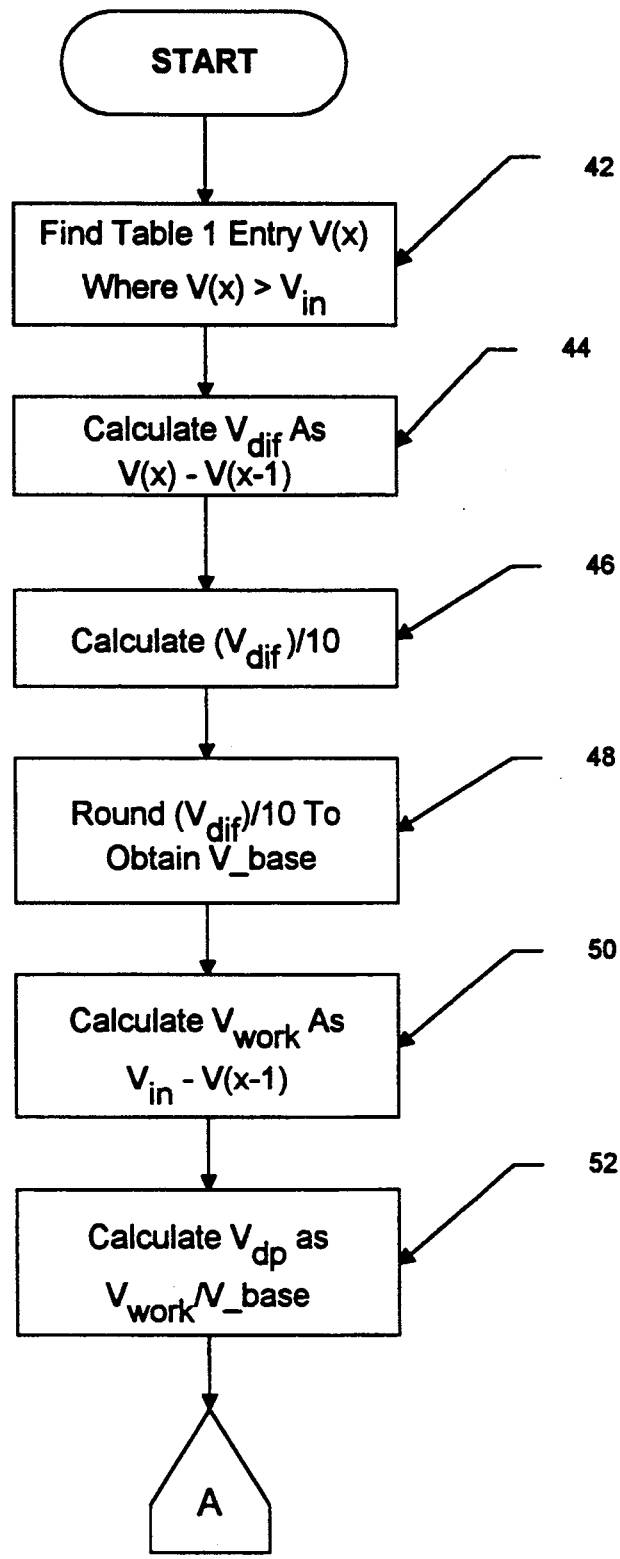
FIGS. 4a and 4b are a flowchart of the steps performed by the microprocessor in converting an input voltage into an output decibel value.
Figure 4B:
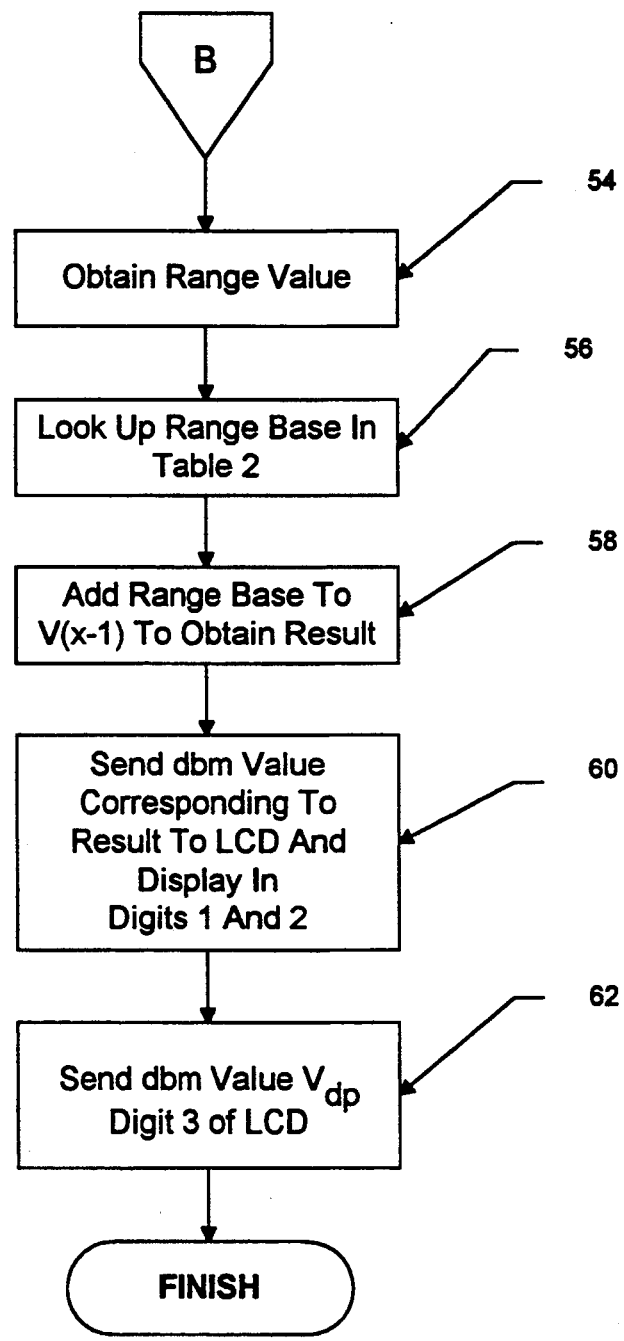

FIGS. 4a and 4b provide a flowchart of the steps performed by the microprocessor 18 (FIG. 1) in converting the input voltage into a dbm value that is displayed on the LCD 16. Once the microprocessor 18 has received the input voltage from the ASIC 12 over data line 34, it looks up values in Table 1 (FIG. 2). Each entry in Table 1 represents a voltage associated with a corresponding dbm value, as was described above. The microprocessor 18 (FIG. 1) finds an entry in Table 1 (FIG. 2) that is the xth entry in the table (denoted as V(x)). This entry is the first entry in Table 1 that is larger than the input voltage (denoted as $V_{in}$). In other words, the microprocessor 18 (FIG. 1) finds an entry V(x) such that V(x) is greater than $V_{in}$ (step 42 in FIGS. 4a and 4b).

The system then determines the difference between the entry V(x) and its predecessor V(x−1), which is less than $V_{in}$. The system determines the difference by subtracting V(x−1) from V(x) (step 44). The resulting difference is denoted as $V_{dif}$.

Having calculated $V_{dif}$, the system divides $V_{dif}$ by ten to break it down into decimal increments (step 46). The system then rounds ($V_{dif}$/10) to obtain a value V_ base (step 48).

The system then calculates $V_{work}$ as the difference between $V_{in}$ and V(x−1) (step 50). $V_{work}$ is indicative of the voltage difference between the input voltage and the closest lower voltage in Table 1 (FIG. 2). Once the system has calculate $V_{work}$, it proceeds to calculate $V_{dp}$ as $V_{work}$/V_base (step 52 in FIG. 4). The subscript dp in $V_{dp}$ is mnemonic for "decimal place". Since the entries V(x) and V(x−1) are indicative of whole number dbm values, it is known that the analog input voltage $V_{in}$ lies somewhere between these values. $V_{dp}$ indicates what fractional position $V_{in}$ occupies in the range separating V(x) and V(x−1). As such, the system converts $V_{dp}$ and V(x−1) into their corresponding dbm values and adds the resulting dbm values. By adding together the dbm values associated with $V_{dp}$ and V(x−1), the system knows the proper dbm value for the scaled down voltage that was sent to the controller 14 (FIG. 1). The microprocessor 18, however, must scale up the dbm value to reflect the actual input voltage.

The upscaling of the dbm value to reflect the input range is performed by initially obtaining the selected range value (step 54 in FIGS. 4a and 4b). As was discussed above, the user selects the input range by using switches 28 and 30 (FIG. 1). Once the range value is known, the base dbm value for that range is looked up in table 2 (FIG. 2) so that it may be used in scaling up the dbm value (step 56 in FIGS. 4a and 4b). The range base is the lowest dbm value for the specified input range. The range base serves as an offset for scaling up the previously determined dbm value. The scaling is performed by adding the range base to V(x−1) to obtain a result (step 58). This dbm value associated with the result is sent to the LCD and displayed in the digit 1 and digit 2 positions (step 60 in FIGS. 4a and 4b). Lastly, the dbm value corresponding to $V_{dp}$ is sent to the LCD and displayed in the digit 3 (see FIG. 3) position of the LCD (step 62 in FIGS. 4a and 4b).

While the present invention has been described with reference to a preferred embodiment thereof, those skilled in the art will know of various changes in form and detail that may be made without departing from the spirit and scope of the present invention as defined in the appended claims.

What is claimed is:

1. In a multimeter, a method of providing a decibel indication of the value of an input analog voltage, comprising the steps of:
   A) providing a memory circuit containing a table of voltage values wherein each entry is associated with a decibel value;
   B) generating an input digital signal representative of an input value determined by the analog voltage;
   C) calculating from the input value an output decibel value by:
      i) comparing the input value with entries in the table to locate a first entry which is larger than the input value;
      ii) locating a second entry in the table that is lower than the input value;
      iii) determining a fractional value that is indicative of where the input value lies in a range between the first entry and the second entry; and
      iv) combining a decibel equivalent of the fractional value with the decibel value associated by the table with one of the first and second entries to produce a decibel equivalent of the input value; and
   D) generating a meter output signal representative of the output decibel value.

2. A method as recited in claim 1 wherein the output decibel value is measured in dbm.

3. A method as recited in claim 1 wherein the multimeter includes a display and the method further comprises the step of applying the meter output signal to the display for display of the output decibel level thereby.

4. A method as recited in claim 1 further comprising the step of rounding the fractional value.

5. A method as recited in claim 1 wherein the entries in the table are organized in a sequence of increasing magnitude.

6. A method as recited in claim 1 wherein the first entry is closer in magnitude to the input value than any other entry in the table that is higher than the input value.

7. A method as recited in claim 1 wherein the second entry is closer in magnitude to the input value than any other entry that is lower than the input value.

8. A method as recited in claim 1 wherein:
   A) the step of generating the input digital signal includes scaling the input analog voltage down by a scale factor from an input range to a scaled-down value in an operational range and generating the input digital signal by converting the scaled-down value to digital form; and 'B) the step of calculating the output decibel value includes adding to the decibel equivalent of the input value an offset that compensates for the scale factor.

9. A method as recited in claim 8 wherein the output decibel value is measured in dbm.

10. A method as recited in claim 8 wherein the multimeter includes a display and the method further comprises the step of displaying the output decibel level on the display.

11. A method as recited in claim 8 further comprising the step of rounding the fractional value.

12. A method as recited in claim 8 wherein the entries in the table are organized in a sequence of increasing magnitude.

13. A method as recited in claim 8 wherein the first entry is closer in magnitude to the input value than any other entry in the table that is higher than the input value.

14. A method as recited in claim 8 wherein the second entry is closer in magnitude to the input value than any other entry that is lower than the input value.

15. A multimeter comprising:
   A) an input circuit for receiving an input analog voltage and generating in response thereto an input digital signal determined thereby;
   B) a memory circuit containing a table of voltage values wherein each entry is associated with a decibel value;
   C) a conversion circuit responsive to the input digital signal for:
      i) calculating therefrom an output decibel value by:
         a) comparing the input value with entries in the table to locate a first entry which is larger than the input value;
         b) locating a second entry in the table that is lower than the input value;
         c) determining a fractional value that is indicative of where the input value lies in a range between the first entry and the second entry; and
         d) combining a decibel equivalent of the fractional value with the decibel value associated by the table with one of the first and second entries to produce a decibel equivalent of the input value; and
      ii) generating a meter output signal representative of the output decibel value.

16. A multimeter as recited in claim 15 wherein the output decibel value is measured in dbm.

17. A multimeter as recited in claim 15 further including a display responsive to the meter output signal for displaying the output decibel value thereon.

18. A multimeter as recited in claim 15 wherein the conversion circuit rounds the fractional value.

19. A multimeter as recited in claim 15 wherein the entries in the table are organized in a sequence of increasing magnitude.

20. A multimeter as recited in claim 15 wherein the first entry is closer in magnitude to the input value than any other entry in the table that is higher than the input value.

21. A multimeter as recited in claim 15 wherein the second entry is closer in magnitude to the input value than any other entry that is lower than the input value.

22. A multimeter as recited in claim 15 wherein:
   A) the input circuit:
      i) includes divider circuitry for scaling the input analog voltage down by a scale factor from an input range to a scaled-down value in an operational range; and ii) generates the digital signal by converting the scaled-down version to a digital form; and B) the conversion circuit calculates the output decibel value by adding to the decibel equivalent of the input value an offset that compensates for the scale factor.

23. A multimeter as recited in claim 22 wherein the output decibel value is measured in dbm.

24. A multimeter as recited in claim 22 further including a display responsive to the meter output signal for displaying the output decibel value thereon.

25. A multimeter as recited in claim 22 wherein the conversion circuit rounds the fractional value.

26. A multimeter as recited in claim 22 wherein the entries in the table are organized in a sequence of increasing magnitude.

27. A multimeter as recited in claim 22 wherein the first entry is closer in magnitude to the input value than any other entry in the table that is higher than the input value.

28. A multimeter as recited in claim 22 wherein the second entry is closer in magnitude to the input value than any other entry that is lower than the input value.

* * * * *